US008753474B2

(12) United States Patent
Nangoy et al.

(10) Patent No.: US 8,753,474 B2
(45) Date of Patent: Jun. 17, 2014

(54) METHOD AND APPARATUS FOR HIGH EFFICIENCY GAS DISSOCIATION IN INDUCTIVE COUPLE PLASMA REACTOR

(75) Inventors: Roy C. Nangoy, Santa Clara, CA (US); Saravjeet Singh, Santa Clara, CA (US); Jon C. Farr, Vallejo, CA (US); Sharma V. Pamarthy, Fremont, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 951 days.

(21) Appl. No.: 12/878,582

(22) Filed: Sep. 9, 2010

(65) Prior Publication Data

US 2011/0073564 A1    Mar. 31, 2011

Related U.S. Application Data

(60) Provisional application No. 61/245,869, filed on Sep. 25, 2009.

(51) Int. Cl.
| | | |
|---|---|---|
| *H01L 21/3065* | (2006.01) | |
| *H01J 37/32* | (2006.01) | |
| *C23C 16/455* | (2006.01) | |
| *C23C 16/505* | (2006.01) | |
| *H01L 21/67* | (2006.01) | |

(52) U.S. Cl.
CPC ....... *H01L 21/30655* (2013.01); *H01L 21/3065* (2013.01); *H01L 21/67069* (2013.01); *H01J 37/321* (2013.01); *H01J 37/3211* (2013.01); *H01J 37/3244* (2013.01); *H01J 37/32449* (2013.01); *H01J 37/3222* (2013.01); *H01J 37/32458* (2013.01); *C23C 16/45508* (2013.01); *C23C 16/45563* (2013.01); *C23C 16/45574* (2013.01); *C23C 16/45587* (2013.01); *C23C 16/45591* (2013.01); *C23C 16/505* (2013.01)
USPC ............ 156/345.33; 156/345.29; 156/345.48; 118/715; 118/723 I; 118/723 IR

(58) Field of Classification Search
CPC ................ H01J 37/3244; H01J 37/321; H01J 37/32449; H01J 37/3211; H01J 37/32633; H01J 37/32458; H01J 37/3222; H01J 37/32357; H01J 2237/334; H01J 37/32009; C23C 16/45574; C23C 16/452; C23C 16/455; C23C 16/45512; C23C 16/45563; C23C 16/45587; C23C 16/45591; C23C 16/505; H01L 21/67063
USPC ............ 156/345.29, 345.33, 345.34, 345.48; 118/715, 723 I, 723 IR
See application file for complete search history.

(56) References Cited

U.S. PATENT DOCUMENTS 4,990,229 A * 2/1991 Campbell et al. ........ 204/298.06
5,766,498 A * 6/1998 Kojima et al. .................. 216/71
(Continued)

FOREIGN PATENT DOCUMENTS

| KR | 10-0655445 | | 12/2006 |
|---|---|---|---|
| KR | 2008-0027459 A | | 3/2008 |
| SU | 612118 A | * | 5/1978 |

OTHER PUBLICATIONS

PCT International Search Report and Written Opinion dated Sep. 24, 2009, for International Application No. PCT/US2009/037647.

(Continued)

*Primary Examiner* — Jeffrie R Lund
(74) *Attorney, Agent, or Firm* — Patterson & Sheridan, LLP

(57) ABSTRACT

Embodiments of the present invention relate to method and apparatus for providing processing gases to a process chamber with improved plasma dissociation efficiency. One embodiment of the present invention provides a baffle nozzle assembly comprising an outer body defining an extension volume connected to a processing chamber. A processing gas is flown to the processing chamber through the extension volume which is exposed to power source for plasma generation.

14 Claims, 9 Drawing Sheets

(56) References Cited

U.S. PATENT DOCUMENTS

| | | | |
|---|---|---|---|
| 6,245,192 B1 | 6/2001 | Dhindsa et al. | |
| 6,409,933 B1 | 6/2002 | Holland et al. | |
| 6,414,648 B1 | 7/2002 | Holland et al. | |
| 6,450,117 B1* | 9/2002 | Murugesh et al. | 118/723 ME |
| 6,462,481 B1 | 10/2002 | Holland et al. | |
| 6,507,155 B1 | 1/2003 | Barnes et al. | |
| 6,616,985 B2* | 9/2003 | Powell et al. | 427/562 |
| 6,685,798 B1 | 2/2004 | Holland et al. | |
| 6,694,915 B1 | 2/2004 | Holland et al. | |
| 6,835,919 B2* | 12/2004 | Tolmachev et al. | 219/494 |
| 6,846,746 B2 | 1/2005 | Rattner et al. | |
| 6,849,554 B2 | 2/2005 | Rattner et al. | |
| 6,872,258 B2 | 3/2005 | Park et al. | |
| 6,893,533 B2 | 5/2005 | Holland et al. | |
| 6,900,133 B2 | 5/2005 | Chinn et al. | |
| 7,074,723 B2 | 7/2006 | Chinn et al. | |
| 7,204,886 B2 | 4/2007 | Chen et al. | |
| 7,571,698 B2* | 8/2009 | Wang et al. | 118/723 R |
| 7,572,647 B2* | 8/2009 | Chen et al. | 438/5 |
| 7,651,587 B2* | 1/2010 | Lu et al. | 156/345.48 |
| 7,682,946 B2* | 3/2010 | Ma et al. | 438/481 |
| 7,722,719 B2* | 5/2010 | Lei et al. | 118/715 |
| 7,740,706 B2* | 6/2010 | Park et al. | 118/715 |
| 7,758,698 B2* | 7/2010 | Bang et al. | 118/715 |
| 7,789,993 B2* | 9/2010 | Chen et al. | 156/345.48 |
| 7,799,704 B2* | 9/2010 | Park et al. | 438/778 |
| 7,850,779 B2* | 12/2010 | Ma et al. | 118/715 |
| 8,313,635 B2* | 11/2012 | Egley et al. | 205/640 |
| 2002/0039625 A1* | 4/2002 | Powell et al. | 427/569 |
| 2002/0144785 A1* | 10/2002 | Srivastava et al. | 156/345.35 |
| 2003/0111963 A1* | 6/2003 | Tolmachev et al. | 315/111.51 |
| 2004/0020599 A1* | 2/2004 | Tanaka et al. | 156/345.29 |
| 2004/0045669 A1 | 3/2004 | Okumura et al. | |
| 2005/0199184 A1* | 9/2005 | Murugesh et al. | 118/715 |
| 2005/0284573 A1* | 12/2005 | Egley et al. | 156/345.33 |
| 2006/0075967 A1* | 4/2006 | Lu et al. | 118/723 I |
| 2006/0118518 A1 | 6/2006 | Rusu et al. | |
| 2006/0130756 A1* | 6/2006 | Liang et al. | 118/715 |
| 2006/0150913 A1* | 7/2006 | Wang et al. | 118/723 IR |
| 2006/0177600 A1* | 8/2006 | Lu et al. | 427/571 |
| 2006/0196603 A1* | 9/2006 | Lei et al. | 156/345.33 |
| 2006/0284563 A1* | 12/2006 | Yoo et al. | 315/111.61 |
| 2007/0013284 A1* | 1/2007 | Lee | 313/231.31 |
| 2007/0034153 A1* | 2/2007 | Lu et al. | 118/723 I |
| 2007/0037397 A1* | 2/2007 | Lu et al. | 438/710 |
| 2007/0119370 A1* | 5/2007 | Ma et al. | 118/723 E |
| 2007/0119371 A1* | 5/2007 | Ma et al. | 118/723 E |
| 2007/0128863 A1* | 6/2007 | Ma et al. | 438/680 |
| 2007/0145021 A1 | 6/2007 | Wang et al. | |
| 2007/0187363 A1* | 8/2007 | Oka et al. | 216/59 |
| 2008/0026597 A1* | 1/2008 | Munro et al. | 438/788 |
| 2008/0078744 A1* | 4/2008 | Wang et al. | 216/67 |
| 2008/0121178 A1* | 5/2008 | Bang et al. | 118/723 I |
| 2008/0121179 A1* | 5/2008 | Park et al. | 118/723 R |
| 2008/0124944 A1* | 5/2008 | Park et al. | 438/778 |
| 2008/0156264 A1* | 7/2008 | Fair et al. | 118/723 E |
| 2008/0156631 A1* | 7/2008 | Fair et al. | 204/164 |
| 2008/0178807 A1* | 7/2008 | Wang et al. | 118/723 R |
| 2008/0178906 A1* | 7/2008 | Egley et al. | 134/1.1 |
| 2008/0185284 A1* | 8/2008 | Chen et al. | 204/164 |
| 2008/0188087 A1* | 8/2008 | Chen et al. | 438/758 |
| 2008/0268171 A1* | 10/2008 | Ma et al. | 427/569 |
| 2009/0028761 A1* | 1/2009 | Devine et al. | 422/186.04 |
| 2009/0042407 A1* | 2/2009 | Bang et al. | 438/787 |
| 2010/0006226 A1* | 1/2010 | Cho et al. | 156/345.33 |
| 2010/0048028 A1* | 2/2010 | Rasheed et al. | 438/758 |
| 2010/0230386 A1* | 9/2010 | Hayashi et al. | 216/60 |
| 2011/0020486 A1* | 1/2011 | Pei | 425/174.4 |
| 2011/0073564 A1* | 3/2011 | Nangoy et al. | 216/67 |
| 2012/0006486 A1* | 1/2012 | Chebi et al. | 156/345.26 |
| 2012/0091098 A1* | 4/2012 | Dinev et al. | 216/68 |
| 2012/0231631 A1* | 9/2012 | Kim | 438/710 |
| 2013/0000558 A1* | 1/2013 | Hara et al. | 118/724 |

OTHER PUBLICATIONS

PCT international search report and written opinion of PCT/US2010/048269 dated Apr. 26, 2011.

* cited by examiner

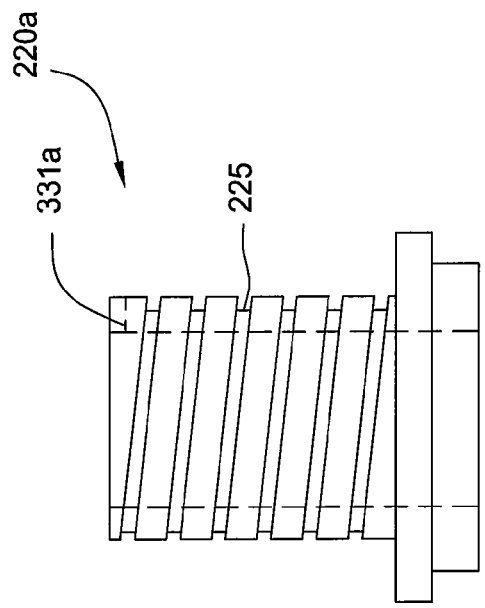
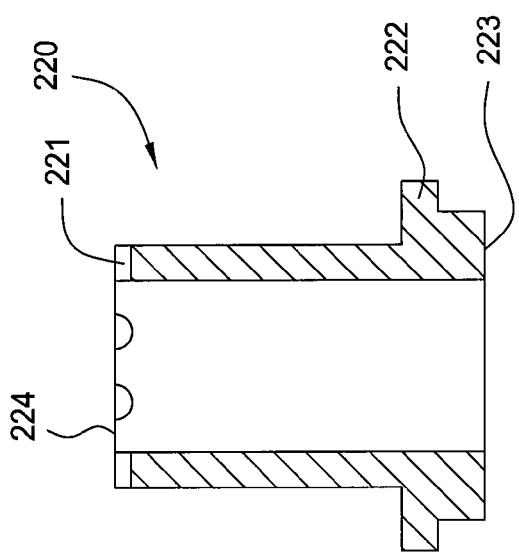
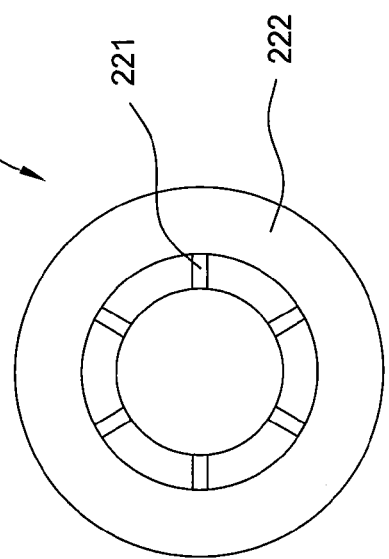
FIG. 3C
FIG. 3A
FIG. 3B

METHOD AND APPARATUS FOR HIGH EFFICIENCY GAS DISSOCIATION IN INDUCTIVE COUPLE PLASMA REACTOR

CROSS REFERENCE TO RELATED APPLICATIONS

This application claims benefit of U.S. Provisional Patent Application Ser. No. 61/245,869, filed Sep. 25, 2009, which is incorporated herein by reference.

BACKGROUND

1. Field

Embodiments of the present invention generally relate a substrate processing system and related substrate process, such as an etching/deposition process. More particularly, embodiments of the present invention relate to method and apparatus for providing processing gases to a process chamber with improved plasma dissociation efficiency.

2. Description of the Related Art

The fabrication of microelectronic devices includes a number of different stages, each including a variety of processes. During one stage, a particular process may include imparting a plasma to the surface of a substrate, such as a silicon substrate, to alter the physical and material properties of the substrate. This process may be known as etching, which may involve the removal of materials to form holes, vias, and/or other openings (referred to herein as "trenches") in the substrate.

Plasma etch reactors are commonly used for etching trenches in semiconductor substrates. These reactors contain a chamber within which the substrate is supported. At least one reactive gas is supplied to the chamber and a radio frequency signal is coupled to the reactive gas to form the plasma. The plasma etches the substrate that is positioned within the reactor. The substrate may also be coupled to a radio frequency signal to bias the substrate during the etching process to enhance etching performance and trench profile.

These trench profiles often require different critical dimensions. The critical dimensions include width, depth, aspect ratio, resist selectivity, roughness of the sidewalls, and planarity of the sidewalls. These critical dimensions may be controlled by various factors, two of which are etching time and etching rate, which further depend on the materials being etched and the type of etching system being used.

One material of particular importance is silicon. Through silicon via ("TSV") etching is a unique application that requires a low frequency bias and a low temperature environment to form deep trenches in a silicon substrate. However, during fabrication, the silicon is generally covered by multiple layers of other materials, such as an oxide layer and a metal layer that are deposited on the silicon. Oxides and metals include different etching requirements than that of silicon, such as a high frequency bias. In addition, during the deposition process, a thin film polymer layer may be deposited onto the layers of the substrate as the trench is being formed to protect the trench sidewalls prior to the etching process. This polymer layer may further include different etching requirements than the oxide, metal, or silicon layers. These distinct requirements influence and increase the complexity of the type of etching system used.

One type of etching system may include in situ plasma etching. Using this first type of etching system, a trench can be formed by alternating the removal and deposition of material on a substrate in a single reactor with a removing plasma and a deposition plasma. Another type of etching system may include remote plasma etching. Using this second type of etching system, a trench can be formed as in the in situ system, except that the plasmas may be generated in a remote reactor prior to being introduced onto the substrate located in the primary reactor. In addition to, the types of etching systems, the process of etching with each system may also vary. Some etching processes employ multi-process approaches, such as a time multiplexed gas modulation ("TMGM") system or a Bosch system, that includes several recipe processes, such as etch and deposition process, or etch, flash, and deposition processes. The TMGM process etches a material for a period of time and then deposits a protective film upon the previously etched surface to protect the surface, typically the sidewalls of the trench, from further etching. These two processes are repeated as a deeper and deeper trench is formed. The different types of etching systems and processes has particular advantages and disadvantages when forming different trench profiles in different material layers.

The material etch rate in an etching system is often a function of source power. Higher etch rates can be achieved with higher source powers because higher source powers lead to higher dissociation rate of processing gases.

Embodiments of the present invention increase etch rate by obtaining higher dissociation rate of processing gases without increasing source power, therefore, increase efficiency of an etch system.

SUMMARY

Embodiments of the present invention generally relate a substrate processing system and related substrate process, such as an etching or deposition process. More particularly, embodiments of the present invention relate to method and apparatus for providing processing gases to a process chamber with improved plasma dissociation efficiency.

One embodiment of the present invention provides a baffle nozzle assembly comprising an outer body defining an inner volume, wherein the outer body has a first inlet channel open to the inner volume and adapted to connect with a gas source, and the outer body has an outlet, an inlet baffle disposed within the inner volume and dividing the inner volume to a first volume and a second volume, wherein the first inlet channel opens near a first end of the first volume, one or more openings located near a second end of the first volume, and the one or more openings connect the first and second volume, and an outlet baffle disposed over the outlet of the outer body, wherein the outlet baffle has one or more first through holes open to the second volume of the inner volume, and the outlet baffle redirects a gas flow from the first through holes.

Another embodiment of the present invention provides a substrate processing system comprising a chamber body defining a processing volume, wherein the chamber body comprises, sidewalls, and a lid, wherein the lid has a center opening adapted to introduce processing gas to the processing volume. The substrate processing system further comprises a first solenoidal coil antenna disposed outside the chamber body over the lid, wherein the first solenoidal coil antenna is coaxial to the center opening and a baffle nozzle assembly coupled to the central opening of lid. Wherein the baffle nozzle assembly comprises a chamber extension disposed over the lid covering the central opening of the lid, wherein the first solenoidal coil antenna surrounds the chamber extension, the chamber extension defines an extension volume in fluid communication with the processing volume through the central opening of the lid, the chamber extension has a first inlet channel open to the extension volume and adapted to connect with a gas source, a gas baffle nozzle disposed within the extension volume and dividing the extension volume to a first volume and a second volume, wherein the first inlet channel opens near a first end of the first volume, one or more openings located near a second end of the first volume, and the one or more openings connect the first and second volume, and a plasma baffle disposed in the central opening of the lid, wherein the plasma baffle has one or more first through holes open to the second volume of the extension volume, and the plasma baffle redirects a gas flow from the first through holes.

Yet another embodiment of the present invention provides a method for processing a substrate comprising positioning a substrate in a processing volume of a processing chamber, wherein the processing chamber comprises sidewalls and a lid defining the processing volume, a solenoidal coil antenna disposed outside the chamber body, and a chamber extension disposed over the lid and surrounded by the solenoidal coil antenna, wherein the chamber extension defines an extension volume in fluid communication with the processing volume via a baffle nozzle assembly. The method further comprises flowing a first processing gas through the extension volume to the processing volume, and simultaneously applying a plasma power source to the solenoidal coil antenna to generate a plasma of the first processing gas within both the extension volume and the processing volume.

BRIEF DESCRIPTION OF THE DRAWINGS

So that the manner in which the above recited features of embodiments of the present invention can be understood in detail, a more particular description of embodiments of the present invention, briefly summarized above, may be had by reference to embodiments, some of which are illustrated in the appended drawings. It is to be noted, however, that the appended drawings illustrate only typical embodiments of this invention and are therefore not to be considered limiting of its scope.

FIG. 3A is a schematic sectional view of a gas baffle nozzle in accordance to one embodiment of the present invention;

FIG. 3B is a schematic sectional view of the gas baffle nozzle of FIG. 3A.

FIG. 3C is a schematic sectional view of a gas baffle nozzle in accordance with another embodiment of the present invention.

To facilitate understanding, identical reference numerals have been used, where possible, to designate identical elements that are common to the figures. It is contemplated that elements disclosed in one embodiment may be beneficially utilized on other embodiments without specific recitation

DETAILED DESCRIPTION

Embodiments of the present invention generally relate a substrate processing system and related substrate process, such as an etching/deposition process. More particularly, embodiments of the present invention relate to method and apparatus for providing processing gases to a process chamber with improved plasma dissociation efficiency.

Embodiments of the present invention extend the path of a processing gas within the exposure to coil antennas so that the processing gas has increased reaction time to dissociate. As a result, higher dissociate rate is obtained without increasing source power.

One embodiment of the present invention provides a plasma reactor having a chamber extension defining an extension volume in fluid connection with a processing volume of the plasma reactor through a nozzle. The extension volume is positioned inside a coil antenna disposed outside the processing volume. A processing gas flows through the extension volume before reaching the processing volume where a substrate to be processed is disposed. The processing gas may be dissociated within the chamber extension before entering to the processing volume, therefore, having a longer time to dissociate.

In one embodiment, the nozzle comprises a gas baffle nozzle disposed in the extension volume providing an extended path for the processing gas.

In one embodiment, the nozzle comprises a plasma baffle disposed within the processing volume. The plasma baffle redirects flow of the processing gas from the chamber extension to avoid high plasma density near the nozzle.

In another embodiment, the nozzle has a by-pass path allowing a processing gas entering the processing volume without going through the chamber extension. In one embodiment, a processing gas may be fed through both the by-path path and the extended path through the chamber extension. In another embodiment, a first processing gas is fed through the extended path through the chamber extension, and a second processing gas is fed through the by-pass line without going through the chamber extension. For example, during a silicon etching process where an etching gas and a deposition gas are alternately flown to the processing chamber, the etching gas may be flown through the extended path to obtain increased plasma density while the deposition gas may be flown through the by-pass line to be dissociated within the processing volume only.

Figure 1:
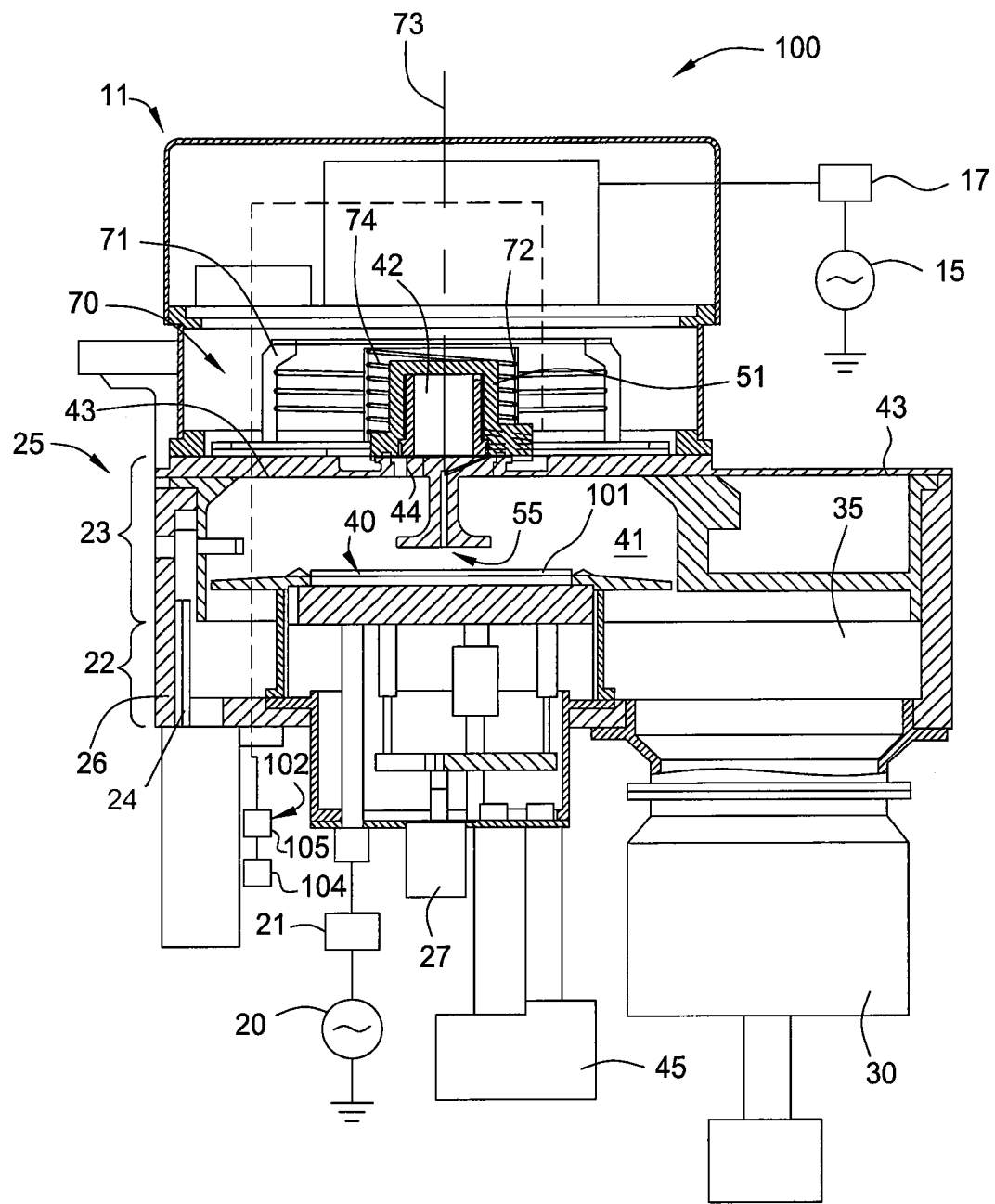
FIG. 1 schematically illustrates a plasma processing system according to one embodiment of the invention.

FIG. 1 schematically illustrates a plasma processing system 100 according to one embodiment of the invention. FIG. 1 illustrates a sectional view of the plasma processing system 100, for processing a variety of substrates and accommodating a variety of substrate sizes.

In one embodiment, the plasma processing system 100 comprise a chamber 25 defining a processing volume 41. In one embodiment, the chamber 25 may comprise sidewalls 26 and a lid 43. The plasma processing system 100 further comprises an antenna assembly 70 disposed over the lid 43 of the chamber 25. A power source 15 and a matching network 17 are coupled to the antenna assembly 70 to provide energy for plasma generation. In one embodiment, the antenna assembly 70 may comprise one or more solenoidal interleaved coil antennas disposed coaxial with an axis of symmetry 73 of the plasma processing system 100. As shown in FIG. 1, the plasma processing system 100 comprises an outer coil antenna 71 and an inner coil antenna 72 disposed over the lid 43. In one embodiment, the coil antennas 71, 72 may be independently controlled. It should be noted, even though two coaxial antennas are described in the plasma processing system 100, other configurations, such as one coil antenna, three or more coil antenna configurations may be contemplated.

In one embodiment, the inner coil antenna 72 comprises one or more electrical conductors wound as a spiral with small pitch and forming an inner antenna volume 74. A magnetic field establishes in the inner antenna volume 74 of the inner coil antenna 72 when an electrical current goes through the one or more electrical conductors. As discussed below, embodiments of the present invention provide a chamber extension volume within the inner antenna volume 74 of the inner coil antenna 72 to generate plasma using the magnetic field in the inner antenna volume 74.

It should be noted, that the inner coil antenna 72 and the outer coil antenna 71 may have other shapes according to application, for example to match a certain shape of a chamber wall, or to achieve symmetry or asymmetry within a processing chamber. In one embodiment, the inner coil antenna 72 and the outer coil antenna 71 may form inner antenna volumes in the shape of hyperrectangle.

The plasma processing system 100 further comprises a substrate support 40 disposed in the processing volume 41. The substrate support 40 supports a substrate 101 during processing. In one embodiment, the substrate support 40 is an electrostatic chuck. A bias power 20 and a matching network 21 may be connected to the substrate support 40. The bias power 20 provides bias potential to a plasma generated in the processing volume 41.

In one embodiment, the lid 43 has an opening 44 to allow entrance of one or more processing gases. In one embodiment, the opening 44 may be disposed near a center axial of the plasma processing system 100 and correspond to the center of the substrate 101 being processed.

In one embodiment, the plasma processing system 100 comprises a chamber extension 51 disposed over the lid 43 covering the opening 44. In one embodiment, the chamber extension 51 is disposed inside a coil antenna of the antenna assembly 70. The chamber extension 51 defines an extension volume 42 in fluid communication with the processing volume 41 via the opening 44.

In one embodiment, the plasma processing system 100 further comprises a baffle nozzle assembly 55 disposed through the opening 44 in the processing volume 41 and the extension volume 42. The baffle nozzle assembly 55 directs one or more processing gases into the processing volume 41 through the extension volume 42. In one embodiment, the baffle nozzle assembly 55 has a by-pass path allowing a processing gas to enter the processing volume 41 without going through the extension volume 42.

Because the extension volume 42 is within the inner antenna volume 74, processing gas in the extension volume 42 is exposed to the magnetic field of the inner coil antenna 72 prior to entering the processing volume 41. The usage of the extension volume 42 increases the plasma intensity within the processing volume 41 without increase power applied to the inner coil antenna 72 or the outer coil antenna 71.

In one embodiment, the size of the inner coil antenna 72 or the chamber extension 51 may be adjusted to obtain desired plasma uniformity and/or dissociation efficiency. For example, the uniformity of the plasma density within the processing volume 41 may be increased by increasing the size (such as diameter) of the inner coil antenna 72, or by reducing the size (such as diameter) of the extension volume 42, or both. However, the gas dissociation efficiency drops when the size of the inner coil antenna 72 increases or the size of the extension volume 42 decreases. In one embodiment, the diameter of the inner coil antenna 72 is between about 2 times to about 4 times of the diameter of the extension volume 42.

In another embodiment, the disassociation rate of processing gas may be adjusted by adjusting power level, such as current, of the inner coil antenna 72. Increasing the current provided to the inner coil antenna 72 may increase the dissociation rate of the processing gas. In one embodiment, the uniformity and/or intensity of a plasma in the processing volume 41 may be adjusted by adjusting current levels of the inner coil antenna 72. In one embodiment, the relative sizes of the extension volume 42 and the inner antenna volume 74 are factored in the current level adjustment of the inner coil antenna 72.

The plasma processing system 100 comprises a pump 30 and a valve 35 to provide vacuum and exhaust to the processing volume 41. The plasma processing system 100 may further comprise a chiller 45 to control the temperature of the plasma processing system 100.

The plasma processing system 100 further comprises a gas delivery system 102 to provide one or more processing gases to the processing volume 41. In one embodiment, the gas delivery system 102 is located in a housing 105 disposed directly adjacent, such as under, the chamber 25. The gas delivery system 102 selectively couples one or more gas sources located in one or more gas panels 104 to the baffle nozzle assembly 55 to provide process gases to the chamber 25. In one embodiment, the gas delivery system 102 may be connected to the baffle nozzle assembly 55 via the chamber extension 51. In one embodiment, the housing 105 is located in close proximity to the chamber 25 to reduce gas transition time when changing gases, minimize gas usage, and minimize gas waste.

The plasma processing system 100 may further include a lift 27 for raising and lowering the substrate support 40 that supports the substrate 101 in the chamber 25.

The chamber 25 further includes sidewalls 26 having a lower liner 22, an upper liner 23, and a slit valve door 24. The valve 35 may be disposed between the pump 30 and the chamber 25 and may be operable to control pressure within the chamber 25.

The gas delivery system 102 may be used to supply at least two different gas mixtures to the chamber 25 at an instantaneous rate as further described below. In an optional embodiment, the plasma processing system 100 may include a spectral monitor operable to measure the depth of an etched trench and a deposited film thickness as the trench is being formed in the chamber 25, with the ability to use other spectral features to determine the state of the reactor. The plasma processing system 100 may accommodate a variety of substrate sizes, for example a substrate diameter of up to about 300 mm.

A method and apparatus for etching a profile, such as a deep trench and through silicon vias (TSV), in a silicon substrate having oxide and metal layers disposed on the substrate, wherein the etching cycle comprises a plurality of plasma processes that are performed in situ within a single, fully automated, reactor is provided. Each such etching cycle comprises a deposition process, a first etch process, and a second etch process. Each of the processes is an individual plasma process that is defined by a composition of a gaseous mixture supplied into the chamber of the reactor where the substrate is supported. Different compositions of gaseous mixtures may be supplied to the chamber during each individual process. The reactor generally comprises a source of power for generating and maintaining a plasma (referred to herein as "source power") and a source of power for biasing a substrate (referred to herein as "bias power"), each independently controlled.

In one embodiment, the plasma processing system 100 may produce etched substrate trench sidewall profiles having angles that taper in a range of about 85 degrees to about 92 degrees, and etched substrate trenches having depths that range from about 10 micrometers to about 500 micrometers. In one embodiment, the plasma processing system 100 may be coupled to a system that includes a metal etch reactor and optionally a post metal etch passivation chamber.

In one embodiment, the power source 15 for generating and maintaining the plasma processes is coupled to the chamber 25 via a power generating apparatus enclosed in a housing 11 disposed above the chamber 25. The power source 15 may be operable to generate a radio frequency within a range from about 12 MHz to about 13.5 MHz, having pulsing capabilities, a power within a range from about 10 watts to about 5000 watts, and may further include a dynamic matching network 17. In one example, the power source 15 may be operable to generate a 13 MHz radio frequency having pulsing capabilities.

The power source 15 may comprise a dual tunable source so that the radio frequency may be changed during an etching cycle. In one embodiment, the power source 15 may comprise a remote plasma source capable of generating high levels of plasma disassociation that is mountable to the plasma processing system 100.

When using a remote plasma source, the plasma processing system 100 may further include a plasma distribution plate or series of plates disposed in the chamber 25 to help distribute the plasma to the substrate. In one embodiment, the plasma processing system 100 may include both an in-situ source power and a remote plasma source power, wherein the plasma is generated in a remote plasma chamber using the remote plasma source power and transferred to the reactor chamber 25, wherein the in-situ power source 15 maintains the generated plasma within the chamber 25. In one embodiment, an etching cycle may be performed wherein the power range, i.e. the wattage of the power source 15, may be increased or decreased during the etching cycle. The power source 15 may be pulsed during the etching cycle.

In one embodiment, the bias power 20 for biasing the substrate 101 is coupled to the chamber 25 and the substrate support 40. The bias power 20 may be operable to generate a radio frequency of about 2 MHz having pulsing capabilities, a low power range from about 10 watts to about 500 watts, and may further include a dynamic matching network 21. In one embodiment, the bias power 20 may be capable of generating a selectable radio frequency range from about 400 kHz to about 2 MHz, from about 100 kHz to about 2 MHz, and from about 100 kHz to about 13.56 MHz, having pulsing capabilities, a low power range from about 10 watts to about 500 watts, and may further include a dynamic matching network or a fixed matching network and a frequency tuner. In one embodiment, an etching cycle may be performed wherein the power range, i.e. the wattage of the bias power 20, may be increased or decreased during the etching cycle. In one embodiment, an etching cycle may include a deposition process, a first etch process, and a second etch process, wherein the bias power 20 is used during the first etch process and the bias power 20 is decreased or increased during the second etch process. For example, the radio frequency of the bias power may be decreased or increased from the first etch process to the second etch process.

The bias power 20 may be pulsed during the etching cycle. To pulse the bias power 20, the radio frequency power is switched on and off during the etching cycle. The pulsing frequency of the bias power 20 may range from about 10 Hz to about 1000 Hz, and may range from about 50 Hz to about 180 Hz. In one embodiment, the switching of the power on and off is uniformly distributed in time throughout the etching cycle. In one embodiment, the timing profile of the pulsing may be varied throughout the etching cycle, and may depend on the composition of the substrate. The percentage of time the bias power 20 is switched on, i.e. the duty cycle as described above, is directly related to the pulsing frequency. In one embodiment, when the pulsing frequency ranges from about 10 Hz to about 1000 Hz, the duty cycle ranges from about 2% to about 40%. In one embodiment, when the pulsing frequency ranges from about 50 Hz to about 180 Hz, the duty cycle ranges from about 5% to about 30%. The bias power frequency and the pulsing frequency may be adjusted depending on the substrate material being processed.

In one embodiment, the chiller 45 may be operable to control the temperature within the chamber 25 and of the substrate located within the chamber 25. The chiller 45 may be located near and coupled to chamber 25. The chiller 45 may include a low temperature chiller, such as a sub-zero point of use thermo-electric chiller, and may further include a direct cooling mechanism for ultra lower temperatures. The chiller 45 is operable to generate temperatures in the range of about −20 degrees to about 80 degrees Celsius, located near the chamber 25 to achieve a faster reaction time, and may include ramping capabilities to allow some level of control to help improve the etch rate. In one embodiment, the chiller 45 is capable of generating temperatures in the range of about −10 degrees to about 60 degrees Celsius and may be located near the chamber 25 to achieve a faster reaction time. In one embodiment, the chiller 45 may be operable to lower the temperature from about −10 degrees Celsius to about −20 degrees Celsius in the chamber 25.

In one embodiment, the plasma processing system 100 is operable to maintain a chamber pressure range of about 10 mTorr to about 1000 mTorr with the pump 30 and the valve 35, which is coupled to the chamber 25. The chamber pressure can be adjusted during the etching cycle to further improve the trench profiles. For example, the chamber pressure may be rapidly decreased or increased when switching from the deposition process to the etch process. The pump 30 may comprise a turbo pump, a 2600 L/s turbo pump for example, operable to process flows in the range of about 100 sccm to about 1000 sccm throughout the chamber 25. In conjunction with the pump 30, the valve 35 may comprise a throttling gate valve with a fast reaction time to help control the process flow and the pressure changes. The plasma processing system 100 may further include a dual manometer to measure the pressure in the chamber 25. In one embodiment, the plasma processing system 100 is operable to maintain a dynamic pressure in the range of about 10 mTorr to about 250 mTorr during the etching cycle. Optionally, an automatic throttling gate valve control or a valve with preset control points may be utilized, and the dynamic pressure may be sustained at a set-point while changing flow parameters.

The bias power may be pulsed, e.g. repeatedly releasing energy, while the source power may be continuously applied. In particular, the bias power may be pulsed using generator pulsing capability set by a control system to provide a percentage of time that the power is on, which is referred to as the "duty cycle." In one embodiment, the time on and the time off of a pulsed bias power may be uniform throughout the etching cycles. For example, if the power is on for about 3 msec and off for about 15 msec, then the duty cycle would be about 16.67%. The pulsing frequency in cycles per second or hertz (Hz) is equal to 1.0 divided by the sum of the on and off time periods in seconds. For example, when the bias power is on for about 3 msec and off for about 15 msec, for a total of about 18 msec, then the pulsing frequency in cycles per second is about 55.55 Hz. In one embodiment, a specialized pulsing profile where the on/off timing changes during the etching cycles may be used. In one embodiment, by changing the bias power applied to the substrate, the etching cycle may switch between the deposition and/or etching processes. The bias power is pulsed to help reduce scalloping of the trench sidewalls, improve resist selectivity, improve the etch rate, and prevent material interface undercut.

It is to be noted, however, that aspects of the invention are not limited to use with silicon etching, but are applicable to etching other types of materials.

As discussed above, embodiments of the present invention provide a plasma reactor having a chamber extension defining an extension volume in fluid connection with a processing volume of the plasma reactor through a nozzle. FIGS. 2-4 schematically illustrate a chamber extension and baffle nozzle assembly in accordance with one embodiment of the present invention.

Figure 2A:
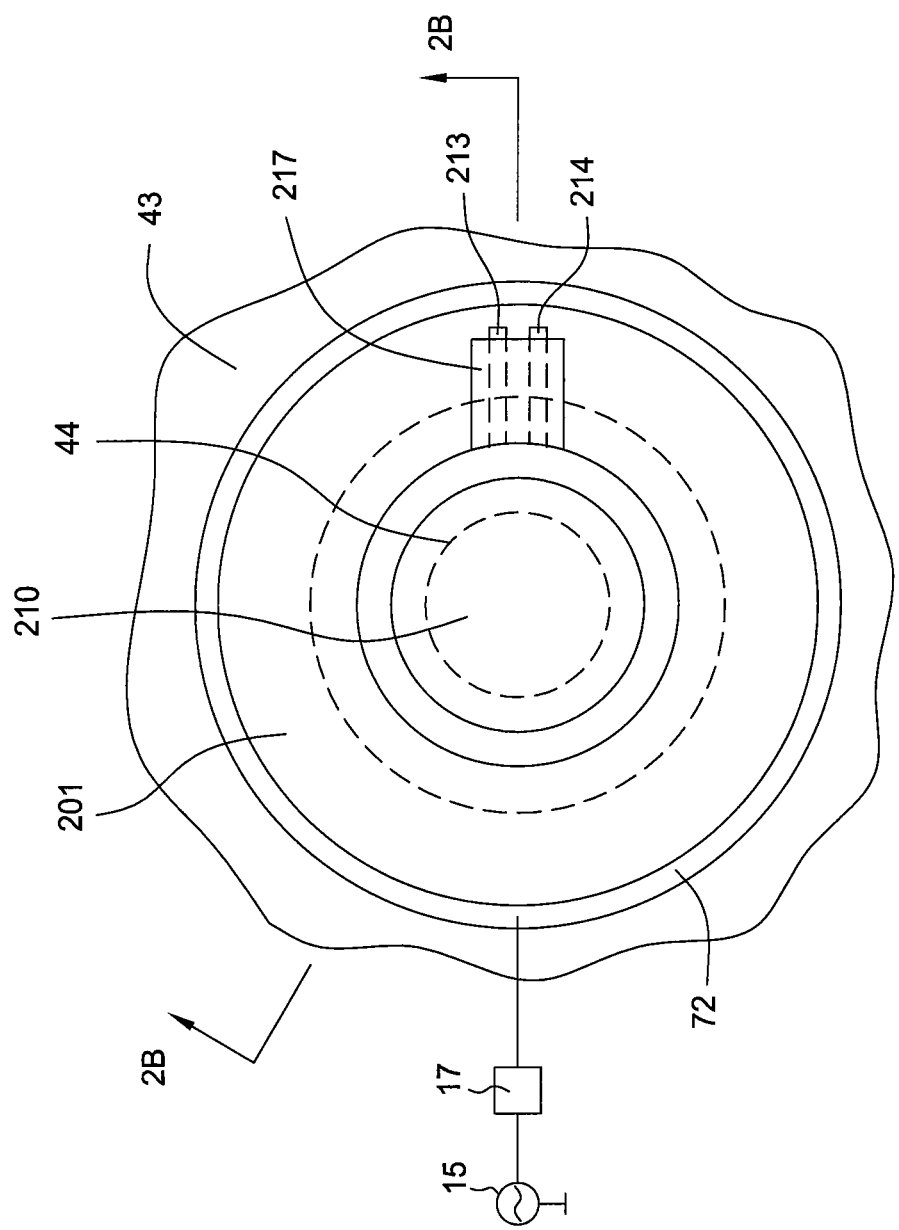
FIG. 2A is a schematic top view of a chamber extension for a substrate etching system according to one embodiment of the invention.
Figure 2B:
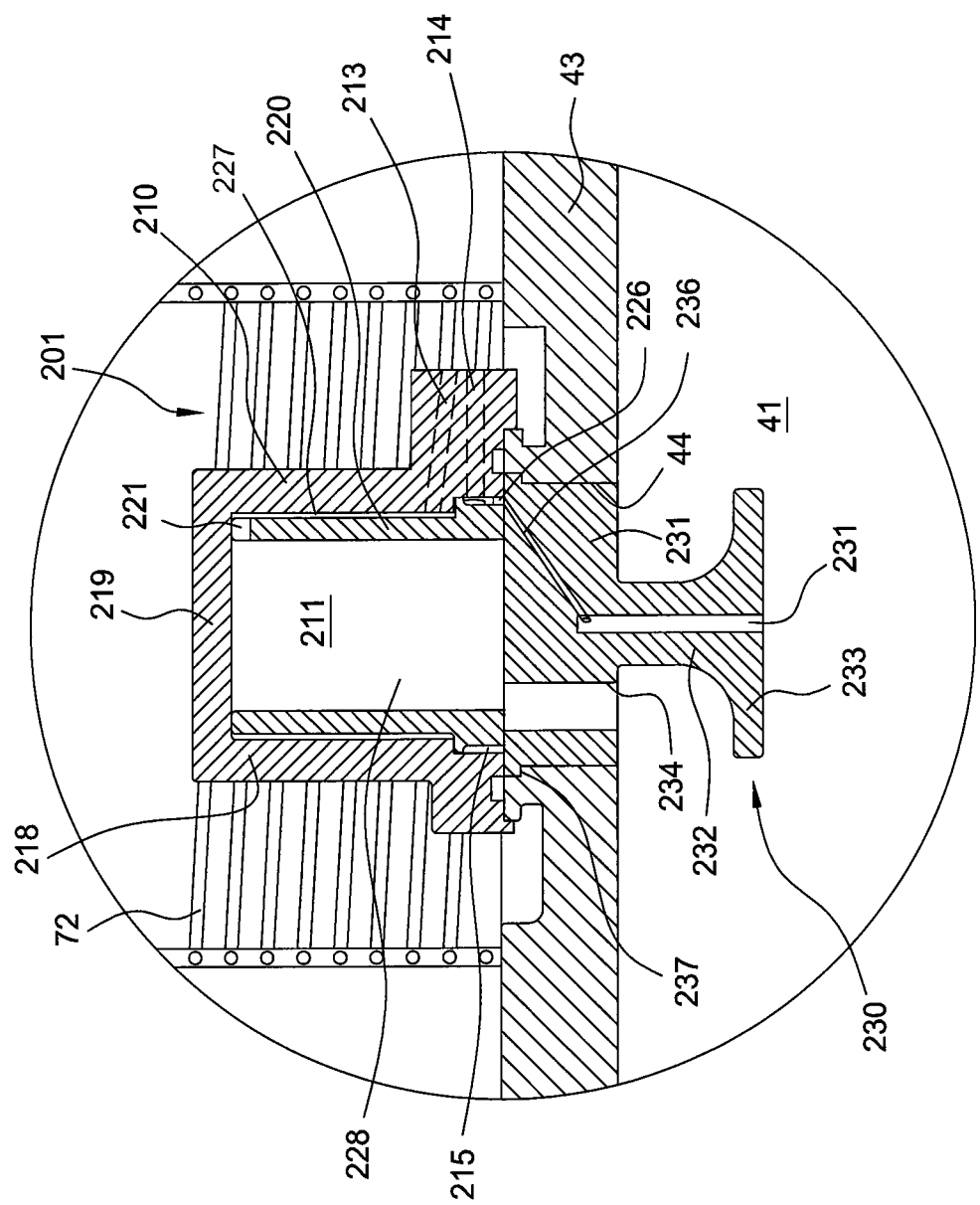
FIG. 2B is a schematic sectional side view of the chamber extension of FIG. 2A showing a nozzle baffle assembly in accordance with one embodiment of the present invention.

FIG. 2A is a schematic top view of a chamber extension and baffle nozzle assembly 201 for a substrate processing system according to one embodiment of the invention. FIG. 2B is a schematic sectional side view of the chamber extension and baffle nozzle assembly 201.

The chamber extension and baffle nozzle assembly 201 may be disposed in a gas inlet for a plasma processing chamber, such as the plasma processing system 100 of FIG. 1, to provide all or a portion of the processing gas with increased exposure to the power source for plasma generation. As shown in FIG. 2A, the chamber extension and baffle nozzle assembly 201 is disposed the opening 44 of the lid 43 within in the inner coil antenna 72.

The chamber extension and baffle nozzle assembly 201 comprises a chamber extension 210 disposed outside the lid 43 and covering the opening 44 and defining an extension volume 211 therein. The extension volume 211 is surrounded by the inner coil antenna 72 and any processing gas within the extension volume 211 may be subject to source power applied to the inner coil antenna 72 to dissociate.

In one embodiment, the chamber extension 210 may be substantially cylindrical. The chamber extension 210 may comprise a cylindrical sidewall 218 and a top 219. The cylindrical sidewall 218 and the top 219 define the extension volume 211. The chamber extension 210 has an inlet extension 217 connected to the sidewall 218. Gas inlet channels 213 and 214 may be formed through the inlet extension and open to the extension volume 211. The gas inlet channels 213, 214 may be connected to a gas delivery system and introduce one or two gas mixtures to the extension volume 211. The chamber extension 210 also has a bottom opening 215 providing an outlet for the processing gas in the extension volume 211. The chamber extension 210 may be disposed such that the opening 215 is coaxial with the opening 44 of the lid 43.

The chamber extension and baffle nozzle assembly 201 further comprises a gas baffle nozzle 220 disposed within the extension volume 211. The gas baffle nozzle 220 is an inlet baffle for the chamber extension 210 to provide restricted paths for gas entering the chamber extension 210. The gas baffle nozzle 220 guides the processing gas through the chamber extension 210 from the gas inlet channels 213, 214 to the opening 215. In one embodiment, the gas baffle nozzle 220 creates an extended path for at least one processing gas for an increased exposure to power source.

In one embodiment, the gas baffle nozzle 220 may be vertical baffles. In one embodiment, the gas baffle nozzle 220 is a hollow cylinder vertically disposed in the extension volume 211. As shown in FIG. 2B, the gas baffle nozzle 220 divides the extension volume 211 in to an outer volume 227 and an inner volume 228. The outer volume 227 is defined between the sidewall 218 of the chamber extension 210 and an outer surface of the gas baffle nozzle 220. The inner volume 228 is defined by an inner surface of the gas baffle nozzle 220 and the top 219 of the chamber extension 210.

FIG. 3A is a schematic sectional view of the gas baffle nozzle 220 in accordance to one embodiment of the present invention. FIG. 3B is a schematic sectional view of the gas baffle nozzle 220. In one embodiment, the gas baffle nozzle 220 may have a plurality of slots 221 formed on an upper end 224. The slots 221 allow fluid communication from the outer volume 227 to the inner volume 228. In one embodiment, the gas baffle nozzle 220 may have a flange 222 formed near a lower end 223. As shown in FIG. 2B, when the gas baffle nozzle 220 is disposed in the chamber extension 210, the flange 222 divides a by-pass volume 226 from the outer volume 227.

In one embodiment, the inlet channel 213 opens near a lower end of the outer volume 227. The processing gas from the inlet channel 213 enters the outer volume 227 near a lower end, travels upward in the outer volume 227, goes through the plurality of slots 221, then enters the inner volume 228 before entering the processing volume 41 of the processing chamber. Path of the processing gas from the inlet channel 213 is extended by the gas baffle nozzle 220 for prolonged exposure to power source.

FIG. 3C is a schematic sectional view of a gas baffle nozzle 220a in accordance with another embodiment of the present invention. The gas baffle nozzle 220a is similar to the gas baffle nozzle 220 except there groves 225 outside. In one embodiment, the groves 225 are one or more spiral groves that provide a vortex flow path in the outer volume 227. The vortex flow path extends the path of the processing gas within the chamber extension 210 even longer.

Referring back to FIG. 2B, processing gas from the inlet channel 214 enters the by-pass volume 226, and then enters the processing volume 41 through a by-pass channel 236. This arrangement allows a by-pass of the chamber extension 210, therefore, avoid extended exposure to power source. This path may be used by deposition gas during a silicon etching process to efficiently use the deposition gas.

The chamber extension and baffle nozzle assembly 201 further comprises a plasma baffle 230 disposed in the opening 44. The plasma baffle 230 is an outlet baffle for the chamber extension 210 to provide restricted paths for gas exiting the chamber extension 210. In one embodiment, the plasma baffle 230 may have a flange 237 allowing the plasma baffle 230 to rest in a recess formed in the opening 44. The plasma baffle 230 provides paths for the processing gas in both the inner volume 228 and the by-pass volume 226 to the processing volume 41 in the processing chamber. The plasma baffle 230 also provides a baffle plate 233 to redirect gas flow from the chamber extension 210, particularly, redirect any plasma flow to avoid concentrated plasma density near the opening 44.

Figure 4A:
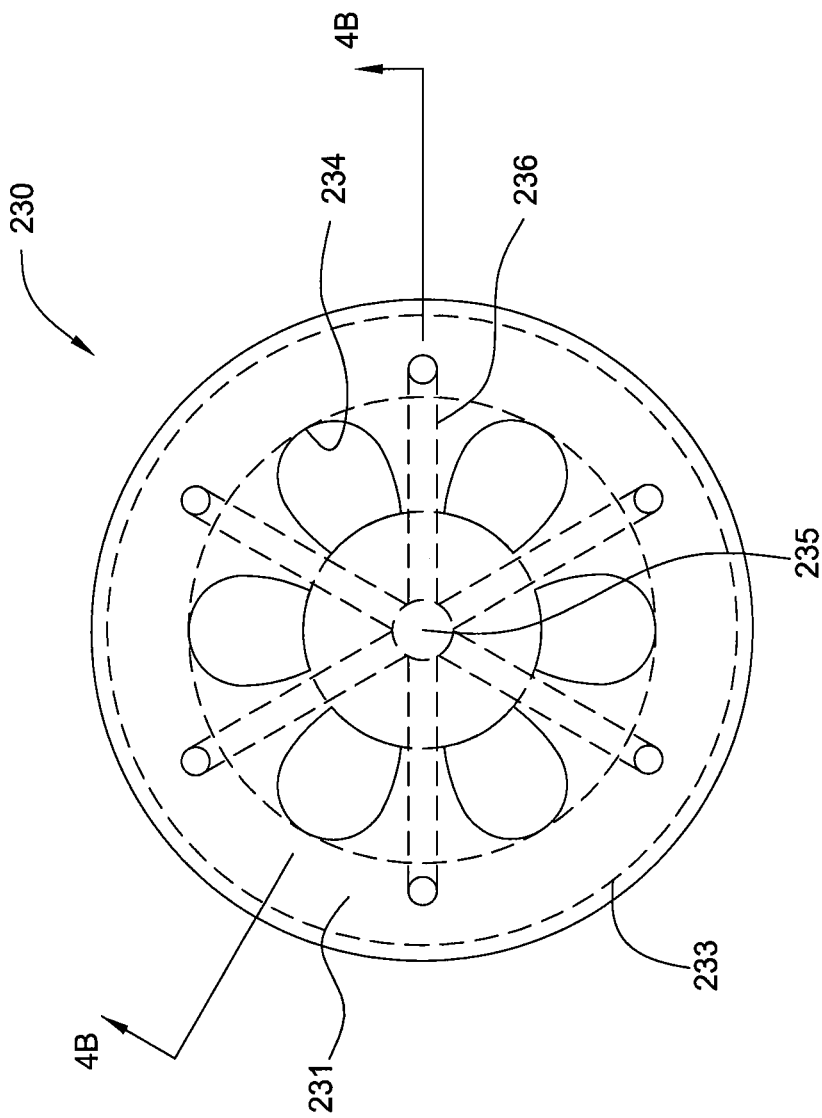
FIG. 4A is a schematic top view of a plasma baffle in accordance with one embodiment of the present invention.
Figure 4B:
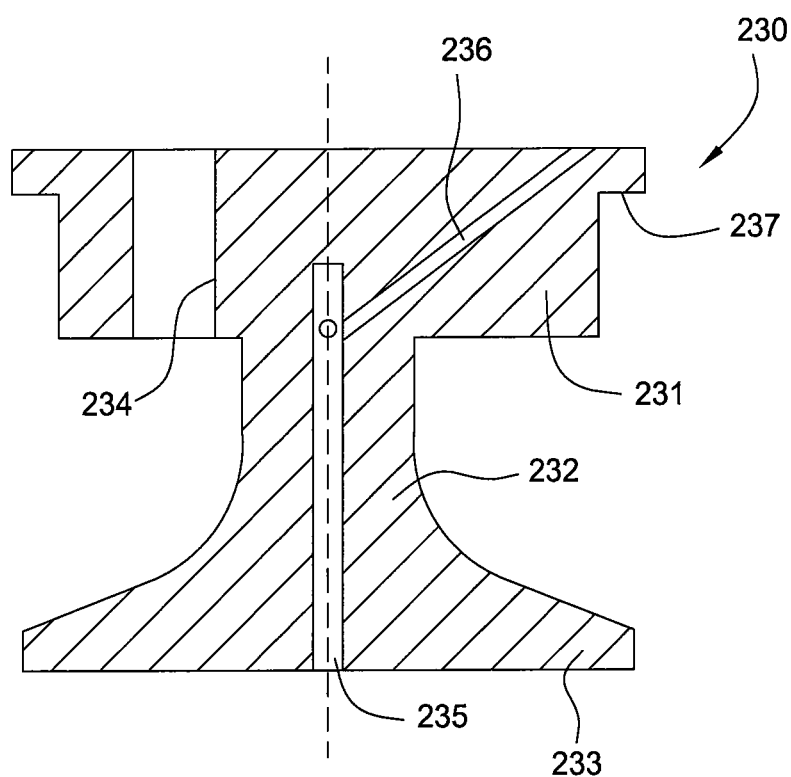
FIG. 4B is a schematic sectional view of the plasma baffle of FIG. 4A.

FIG. 4A is a schematic top view of the plasma baffle 230 in accordance with one embodiment of the present invention. FIG. 4B is a schematic sectional view of the plasma baffle 230. As shown in FIG. 4B, the plasma baffle 230 may comprise a blocker plate 231, a stem 232 extending from the blocker plate 231, and a baffle plate 233 disposed on a distal end of the stem 232.

The blocker plate 231 rests in the opening 44 of the lid 43. In one embodiment, a plurality of through holes 234 are formed in the blocker plate 231. The through holes 234 allow gas flow from the inner volume 228 to the processing volume 41. The baffle plate 233 prevents the flow from the through holes 234 to directly reach the substrate disposed underneath the opening 44. The baffle plate 233 directs the flow sideways.

In one embodiment, the plasma baffle 230 has a center channel 235 formed in the stem 232 and the baffle plate 233. The center channel 235 opens at the baffle plate 233 to the processing volume 41. In one embodiment, the center channel 235 does not go through the blocker plate 231. In one embodiment, a plurality of by-pass channels 236 are formed in the blocker plate 231 connecting the by-pass volume 226 and the center channel 235. Referring to FIG. 2B, the processing gas from the inlet channel 214 may enter the by-pass volume 226, goes through the by-pass channels 236 to the center channel 235, then to the processing volume 41 of the processing chamber.

In one embodiment, the plasma baffle 230 may be formed in one piece. In another embodiment, the plasma baffle 230 may be formed in several pieces to allow easy assembly. Particularly, the blocker plate 231 may comprise two pieces separated stem 232 to allow installation when the baffle plate 233 is larger than the opening 44. In another embodiment, the baffle plate 233 may be a separate piece from the stem 232 and the blocker plate 231.

Figure 5:
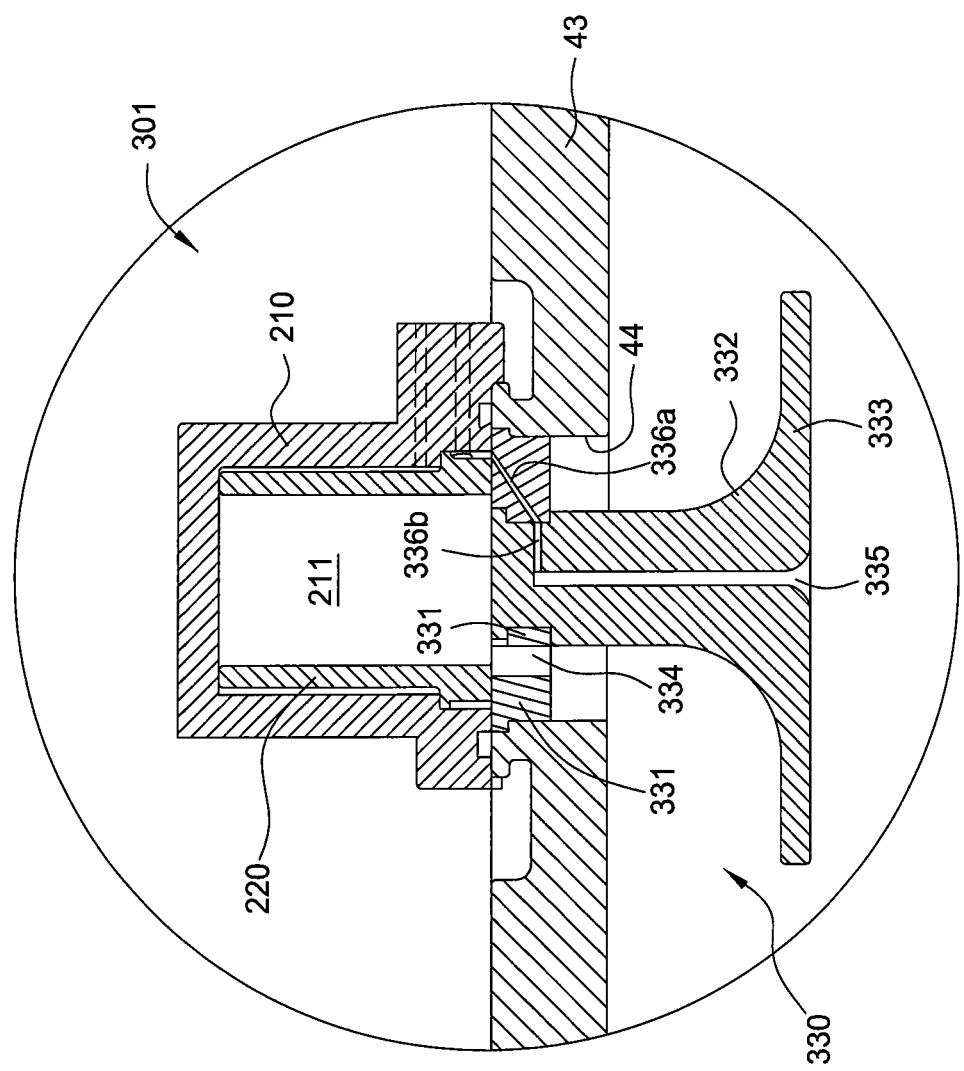
FIG. 5 is a schematic sectional side view of a chamber extension and nozzle baffle assembly in accordance with another embodiment of the present invention.

FIG. 5 is a schematic sectional side view of a chamber extension and baffle nozzle assembly 301 in accordance with another embodiment of the present invention.

The chamber extension and baffle nozzle assembly 301 comprises the same chamber extension 210 and the gas baffle nozzle 220 as the chamber extension and baffle nozzle assembly 201 of FIGS. 2A-2B. The chamber extension and baffle nozzle assembly 301 comprises a plasma baffle 330, which include multiple pieces. The plasma baffle 330 comprises two or more blocker plates 331 forming a clamp around a stem 332. A baffle plate 333 is formed on a distal end of the stem 332. The baffle plate 333 is larger than the opening 44 in the lid 43. Through holes 334 are formed through the blocker plates 331 for gas flow from the chamber extension 210. By-pass channels 336a, 336b are formed in the blocker plate 331 and the stem 332 respectively. The by-pass channels 336b open to a center channel 335 formed in the stem 332 and the baffle plate 333.

Figure 6:
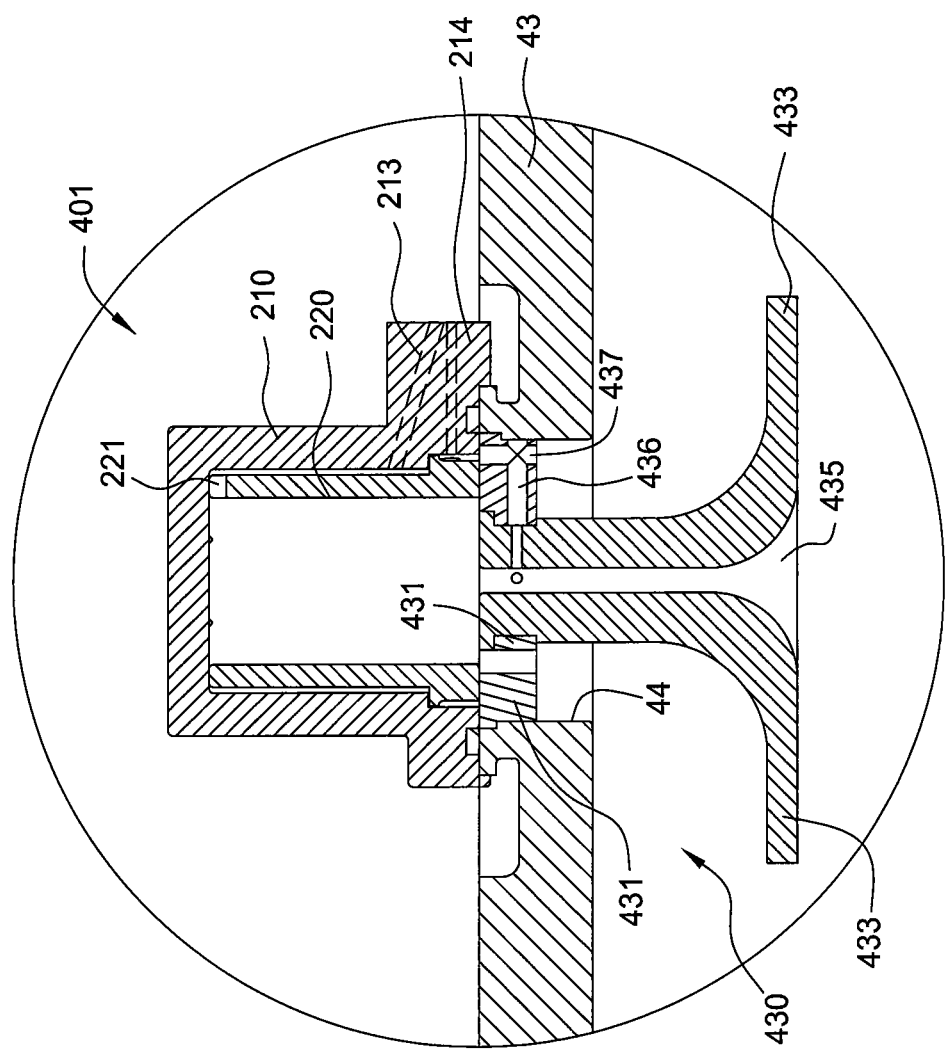
FIG. 6 is a schematic sectional side view of a chamber extension and nozzle baffle assembly in accordance with another embodiment of the present invention.

FIG. 6 is a schematic sectional side view of the chamber extension and baffle nozzle assembly 401 in accordance with another embodiment of the present invention. The chamber extension and baffle nozzle assembly 401 comprises a plasma baffle 430 including a baffle plate 433 and a blocker plate 431. The chamber extension and baffle nozzle assembly 401 is similar to the chamber extension and baffle nozzle assembly 301 except a center channel 435 is formed through the plasma baffle 430 allowing a portion of the gas in the chamber extension 210 to flow directly towards the processing chamber without being redirected by the baffle plate 433. In one embodiment, cross channels 437 and 436 may be formed in the blocker plates 431 directing a portion of the processing gas from the inlet channel 214 through the channel 436 and the center channel 435 without being redirected by the baffle plate 433, and direction another portion of the processing gas from the inlet channel through the channel 437 then to be redirected by the baffle plate 433.

Figure 7:
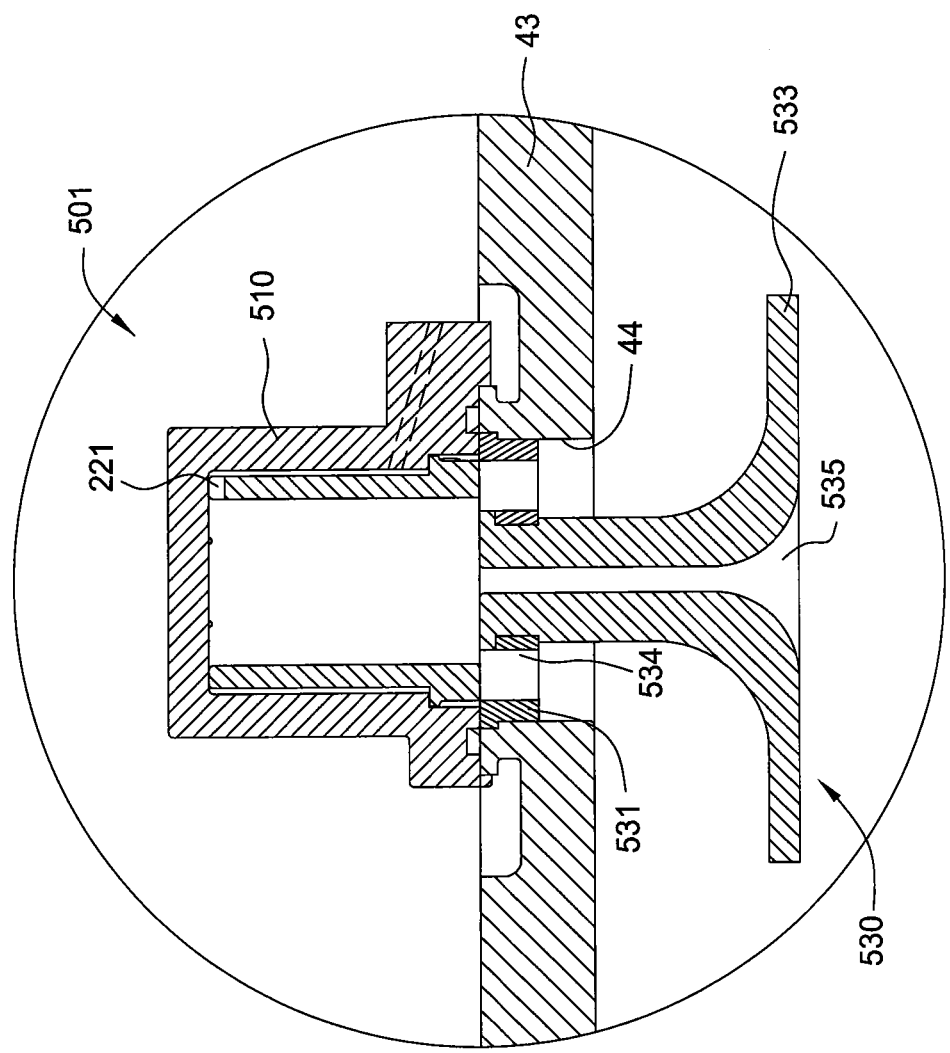
FIG. 7 is a schematic sectional side view of a chamber extension and nozzle baffle assembly in accordance with one embodiment of the present invention.

FIG. 7 is a schematic sectional side view of the chamber extension and baffle nozzle assembly 501 in accordance with another embodiment of the present invention. The chamber extension and baffle nozzle assembly 501 comprises the chamber extension 510 and a plasma baffle 530 including a blocker plate 531 and a baffle plate 533. The chamber extension and baffle nozzle assembly 501 is similar to the chamber extension and baffle nozzle assembly 401 except that there is no by-pass channels formed in the blocker plates 531. All processing gas goes through the chamber extension 210 and subjects to extended power source exposure. A portion of the processing gas goes through a plurality of through holes 534 and is redirected by a baffle plate 533 and another portion of the processing gas goes through a center channel 535 without being redirected.

As discussed above, embodiments of the present invention may be used to perform various plasma processes, such as an etch process for through silicon vias (TSV) during which mixtures of an etching gas and a deposition gas are supplied to a plasma chamber alternately.

During a TSV etching process, a substrate being processed may be disposed in a plasma reactor, such as the processing system 100 of FIG. 1. The substrate may be positioned on the substrate support 40 in the processing volume 41.

Next, a mixture of etching gas is flowing to the processing volume 41 via the chamber extension 51 while power source is applied to the solenoidal coil antennas 71 and 72 to generate a plasma of the etching gas within both the extension volume 42 and the processing volume 41. In one embodiment, the power source of the antennas 71 and 72 may be individually controlled for plasma generation. In one embodiment, the etching gas may be flown simultaneously through a by-pass passage to obtain certain mixture of plasma and non-dissociated etching gas in the processing volume 41.

After ceasing the flow of the etching gas, a deposition gas may be flown to the processing volume 41 and a power source applied to the antennas 71, 72 for a deposition process. In one embodiment, distribution of power source applied to the antennas 71, 72 may be adjusted from the etching process to obtain plasma uniformity in the processing volume 41. In one embodiment, the deposition gas may be flown through a by-pass path without going through the chamber extension 51 to avoid early dissociation and waste of the deposition gas. In another embodiment, the deposition gas may be flown through both the by-pass path and the chamber extension 51.

In one embodiment, the etching and deposition processes can be repeated until vias are formed.

While the foregoing is directed to embodiments of the invention, other and further embodiments of the invention may be devised without departing from the basic scope thereof, and the scope thereof is determined by the claims that follow.

What is claimed is:
1. A baffle nozzle assembly, comprising:
an outer body defining an inner volume, wherein the outer body has a first inlet channel open to the inner volume and adapted to connect with a gas source, and the outer body has an outlet;
a cylindrical inlet baffle disposed within the inner volume and dividing the inner volume to a first volume and a second volume, wherein the first inlet channel opens near a first end of the first volume, one or more openings located near a second end of the first volume, and the one or more openings connect the first and second volume; and
an outlet baffle disposed over the outlet of the outer body, wherein the outlet baffle has one or more first through holes open to the second volume of the inner volume, and the outlet baffle redirects a gas flow from the first through holes.

2. The baffle nozzle assembly of claim 1, wherein the outlet baffle comprises:
a blocker plate disposed over the outlet of the outer body, wherein the one or more first through holes are formed in the blocker plate;
a stem extending from the blocker plate at an opposite side of the outer body; and
a baffle plate on a distal end of the stem, wherein the baffle plate is substantially parallel to the blocker plate.

3. The baffle nozzle assembly of claim 2, wherein the outer body has a second inlet channel open to the inner volume and adapted to connect with a gas source, the cylindrical inlet baffle further divides the inner volume to a third volume, and the second inlet channel opens to the third volume.

4. The baffle nozzle assembly of claim 3, wherein the outlet baffle has a center gas channel formed in the stem and through the baffle plate and one or more by-pass channels connecting the center gas channel to the third volume.

5. The baffle nozzle assembly of claim 4, wherein the center gas channel is a through hole in the outlet baffle and is in fluid communication with the second volume.

6. The baffle nozzle assembly of claim 4, wherein the blocker plate has one or more second through holes open to the third volume.

7. The baffle nozzle assembly of claim 1, wherein the outer body comprises sidewalls and a top defining the inner volume, and the outlet is an opening opposing the top, the cylindrical inlet baffle comprises sidewalls substantially parallel to the sidewalls of the outer body, the sidewalls of the cylindrical inlet baffle divide the inner volume to the first volume and the second volume, the first volume is defined by sidewalls of the outer body and sidewalls of the cylindrical inlet baffle, and the second volume is defined by the sidewalls of the cylindrical inlet baffle and the top of the outer body.

8. The baffle nozzle assembly of claim 7, wherein the sidewalls of the cylindrical inlet baffle have a plurality slots formed on an upper side, and the plurality of slots and the top of the outer body form the one or more openings connecting the first volume and second volume.

9. The baffle nozzle assembly of claim 7, wherein the inner volume is substantially cylindrical, and the cylindrical inlet baffle is a cylindrical side wall having spiral groves formed on outer side, the spiral groves allow vortex flow in the first volume.

10. A substrate processing system, comprising:
a chamber body defining a processing volume, wherein the chamber body comprises:
sidewalls; and
a lid, wherein the lid has a center opening adapted to introduce processing gas to the processing volume;
a first solenoidal coil antenna disposed outside the chamber body over the lid, wherein the first solenoidal coil antenna forms an inner antenna volume and is coaxial to the center opening; and
a baffle nozzle assembly coupled to the central opening of lid and partially disposed in the inner antenna volume, wherein the baffle nozzle assembly comprises:
a chamber extension disposed over the lid covering the central opening of the lid, wherein the chamber extension is disposed in the inner antenna volume, the chamber extension defines an extension volume in fluid communication with the processing volume through the central opening of the lid, the chamber extension has a first inlet channel open to the extension volume and adapted to connect with a gas source;
a cylindrical gas baffle nozzle disposed within the extension volume and dividing the extension volume to a first volume and a second volume, wherein the first inlet channel opens near a first end of the first volume, one or more openings located near a second end of the first volume, and the one or more openings connect the first and second volume; and
a plasma baffle disposed in the central opening of the lid, wherein the plasma baffle has one or more first through holes open to the second volume of the extension volume, and the plasma baffle redirects a gas flow from the first through holes.

11. The substrate processing system of claim 10, wherein the plasma baffle comprises:
a blocker plate disposed in the center opening of the lid, wherein the one or more first through holes are formed in the blocker plate;
a stem extending from the blocker plate towards the processing volume; and
a baffle plate on a distal end of the stem, wherein the baffle plate is substantially parallel to the blocker plate.

12. The substrate processing system of claim 11, the chamber extension has a second inlet channel open to the extension volume and adapted to connect with a gas source, the cylindrical gas baffle nozzle further divides the extension volume to a third volume, and the second inlet channel opens to the third volume.

13. The substrate processing system of claim 12, wherein the plasma baffle has a center gas channel formed in the stem and the baffle plate, the center gas channel opens to the processing volume, and the blocker plate has one or more by-pass channels formed therein and connecting the center gas channel to the third volume.

14. The substrate processing system of claim 10, wherein the first solenoidal antenna comprises one or more conductors wound as a spiral and the inner antenna volume is substantially cylindrical.

* * * * *